(12) United States Patent
Hertz et al.

(10) Patent No.: US 7,852,075 B1
(45) Date of Patent: Dec. 14, 2010

(54) MAGNETIC RESONANCE IMAGING USING ADAPTIVE PHASE ENCODING GRADIENT

(75) Inventors: David Hertz, Dix Hills, NY (US); Rajendra K. Shenoy, Dix Hills, NY (US)

(73) Assignee: Fonar Corporation L.P., Melville, NY (US)

( * ) Notice: Subject to any disclaimer, the term of this patent is extended or adjusted under 35 U.S.C. 154(b) by 115 days.

(21) Appl. No.: 12/249,569

(22) Filed: Oct. 10, 2008

Related U.S. Application Data

(63) Continuation of application No. 11/389,535, filed on Mar. 27, 2006, now Pat. No. 7,436,176.

(51) Int. Cl.
*G01V 3/00* (2006.01)

(52) U.S. Cl. ...................... 324/307; 324/309

(58) Field of Classification Search ......... 324/300–322; 600/407–445
See application file for complete search history.

(56) References Cited

U.S. PATENT DOCUMENTS

| | | | |
|---|---|---|---|
| 4,706,026 A * | 11/1987 | Pelc et al. ............ | 324/309 |
| 5,320,099 A * | 6/1994 | Roberts et al. ......... | 600/413 |
| 6,249,595 B1 | 6/2001 | Foxall et al. .......... | 382/128 |
| 6,700,374 B1 | 3/2004 | Wu et al. ............. | 324/312 |
| 6,703,834 B2 * | 3/2004 | Ikezaki .............. | 324/307 |
| 6,847,209 B2 | 1/2005 | Shenoy et al. ......... | 324/309 |
| 6,940,280 B2 | 9/2005 | Asano et al. .......... | 324/307 |
| 6,980,001 B2 * | 12/2005 | Paley et al. ........... | 324/318 |
| 7,436,176 B2 * | 10/2008 | Hertz et al. ........... | 324/307 |
| 2002/0153889 A1 * | 10/2002 | Garwood et al. ........ | 324/307 |
| 2008/0150526 A1 * | 6/2008 | Zur .................. | 324/307 |

* cited by examiner

*Primary Examiner*—Brij B Shrivastav
(74) *Attorney, Agent, or Firm*—Raymond Van Dyke

(57) ABSTRACT

Through modification of the phase-encoding gradient, a method and apparatus increases the effectiveness of a Magnetic Resonance Imaging (MRI) device by decreasing scan time without noticeably decreasing the signal-to-noise ratio. In an MRI device, a patient is subjected to a constant magnetic field, and then radio frequency (RF) pulses are used to excite the nuclei in the patient's body. The nuclei release a corresponding RF signal as the nuclei relax, which can be measured and mapped into a visual display. The RF pulses used to excite the nuclei in the body cooperate with a slice select gradient and a phase-encoding gradient. When the phase-encoding gradient is indexed and prioritized according to contribution to image quality, then phase-encoding values with little or no contribution to image quality need not be acquired but may be replaced with randomized system noise, thereby decreasing total scan time without reducing the signal-to-noise ratio.

20 Claims, 5 Drawing Sheets

X = maximum and minimum values on the curve
O = zero crossing value
△ = M phase encoding midpoints between a maximum or a minimum and a zero crossing
☐ = additional phase encoding midpoints between an M phase encoding midpoint and a maximum or a minimum or a zero crossing

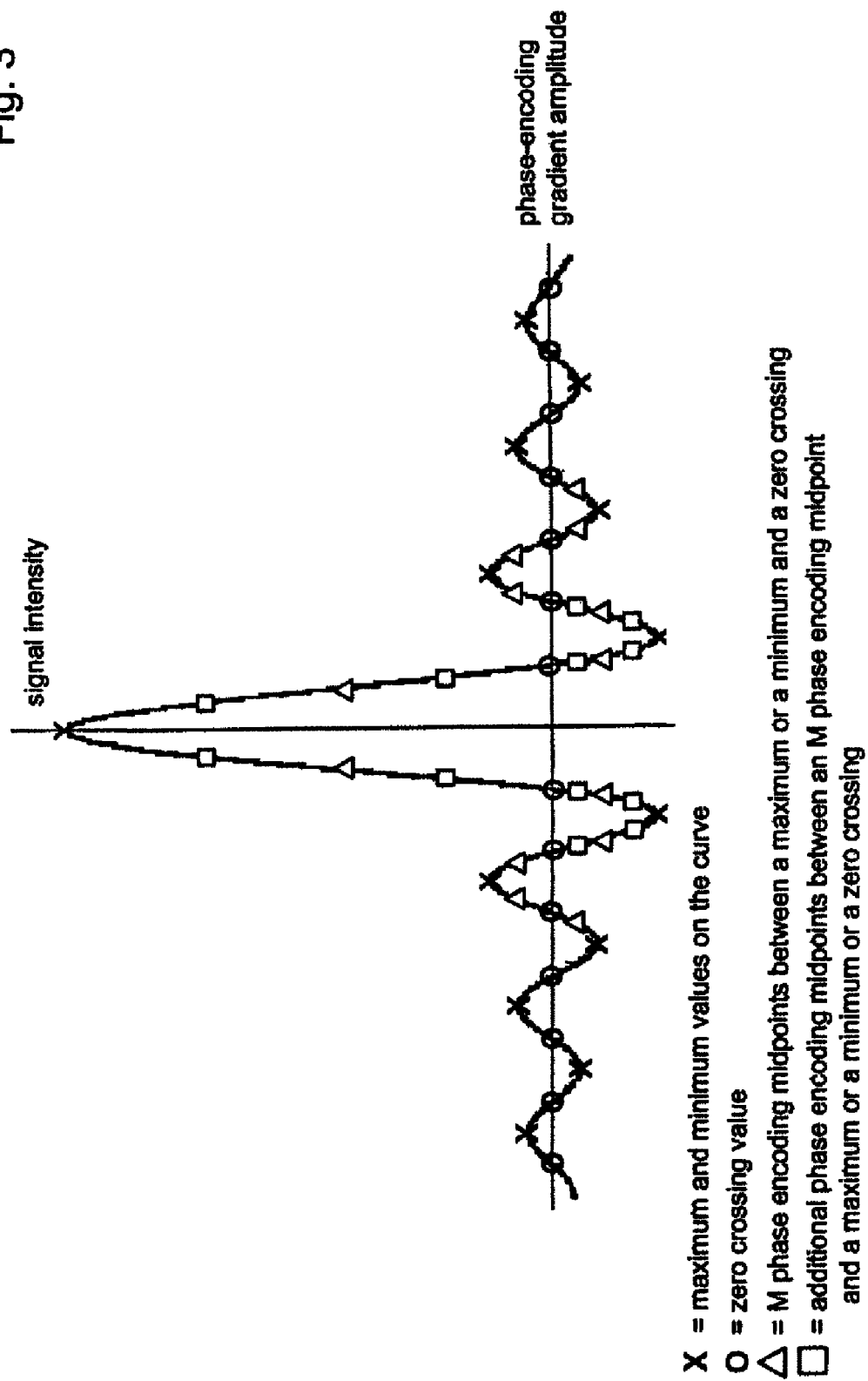

MAGNETIC RESONANCE IMAGING USING ADAPTIVE PHASE ENCODING GRADIENT

This is a continuation of application Ser. No. 11/389,535, filed Mar. 27, 2006 now U.S. Pat. No. 7,436,176.

TECHNICAL FIELD

The technical field generally relates to magnetic resonance imaging and more specifically to a method for improving the efficiency of a magnetic resonance imaging apparatus through application of the phase-encoding gradient.

BACKGROUND

Magnetic resonance imaging (MRI), also called nuclear magnetic resonance imaging (NMR imaging), is a non-destructive method for the analysis of materials and is used extensively in medical imaging. It is generally non-invasive and does not involve ionizing radiation. In general terms, nuclear magnetic moments are excited at specific spin precession frequencies, which are proportional to an external main magnetic field. The radio frequency (RF) signals resulting from the precession of these spins are collected using receiver coils. By manipulating the magnetic fields, an array of signals is provided representing different regions of the volume under study. These signals are combined to produce a volumetric image of the nuclear spin density of the object.

In MRI, a body is subjected to a constant main magnetic field. Another magnetic field, in the form of electromagnetic radio frequency (RF) pulses, is applied orthogonally to the constant magnetic field. The RF pulses have a particular frequency that is chosen to affect particular nuclei (typically hydrogen) in the body. The RF pulses excite the nuclei, increasing the energy state of the nuclei. After the pulse, the nuclei relax and release RF emissions, corresponding to the RF pulses, which are measured and processed into images for display.

When hydrogen nuclei relax, the frequency that they transmit is positively correlated with the strength of the magnetic field surrounding them. For example, a magnetic field gradient along the z-axis, called the "slice select gradient," is set up when the RF pulse is applied, and is shut off when the RF pulse is turned off. This gradient causes the hydrogen nuclei at the high end of the gradient (where the magnetic field is stronger) to precess at a high frequency (e.g., 26 MHz), and those at the low end (weaker field) to precess at a lower frequency (e.g., 24 MHz). When the RF pulse in a narrow band is applied, only those nuclei which precess at that particular frequency will be tilted, to later relax and emit a radio transmission. That is, the nuclei "resonate" to that particular frequency. For example, if the magnetic gradient caused hydrogen nuclei to process at rates from 24 MHz at the low end of the gradient to 26 MHz at the high end, and the gradient were set up such that the high end was located at the patient's head and the low end at the patient's feet, then a 24 MHz RF pulse would excite the hydrogen nuclei in a slice near the feet, and a 26 MHz pulse would excite the hydrogen nuclei in a slice near the head. When a single "slice" along the z-axis is selected; only the protons in this slice are excited by the specific RF pulse to a higher energy level, to later relax to a lower energy level and emit a radio frequency signal.

The second dimension of the image is extracted with the help of a phase-encoding gradient. Immediately after the RF pulse ceases, all of the nuclei in the activated higher energy level slice are in phase. Left to their own devices, these vectors would relax. In MRI, however, the phase-encoding gradient (in the y-dimension) is briefly applied in order to cause the magnetic vectors of nuclei along different portions of the gradient to have a different phase advance. Typically, the sequence of pulses is repeated to collect all the data necessary to produce an image. As the sequence of pulses is repeated, the strength of the phase-encoding gradient is stepped linearly, as the number of repetitions progresses. That is, the phase-encoding gradient may be evenly incremented after each repetition. The number of repetitions of the pulse sequence is determined by the type of image desired and can be any integer, typically from 1 to 1024, although additional phase encoding steps are utilized in specialized imaging sequences. The polarity of the phase encoding gradient may also be reversed to collect additional RF signal data. For example, when the number of repetitions is 1024, for 512 of the repetitions, the phase encoding gradient will be positive. Correspondingly, for the other 512 repetitions, a negative polarity phase encoding gradient of the same magnitude is utilized.

After the RF pulse, slice select gradient, and phase-encoding gradient have been turned off, the MRI instrument sets up a third magnetic field gradient, along the x-axis, called the "frequency encoding gradient" or "read-out gradient." This gradient causes the relaxing protons to differentially precess, so that the nuclei near the lower end of the gradient begin to precess at a faster rate, and those at the higher end precess at an even faster rate. Thus, when these nuclei relax, the fastest ones (those which were at the high end of the gradient) will emit the highest frequency RF signals. The frequency encoding gradient is applied only when the RF signals are to be measured. The second and third dimensions of the image are extracted by means of Fourier analysis.

While the z-axis was used as the slice-select axis in the above example, similarly, either the x-axis or y-axis may be set up as the slice-select axis depending upon the desired image orientation and the anatomical structure of the object of interest being scanned. For example, when a patient is laying supine in the main magnetic field, the x-axis is utilized as the slice-select axis to acquire sagittal images, and the y-axis is utilized as the slice-select axis to acquire coronal images.

Regardless of the orientation of the selected scan, mathematically, the slice select gradient, phase-encoding gradient, and read-out gradient are orthogonal. The result of the MRI scan in the true domain representation k-space is converted to image display data after a 2D or 3D Fast Fourier transform (FFT). Generally, in a transverse slice, the readout gradient is related to the $k_x$ axis and the phase-encoding gradient is related to the $k_y$ axis. In 3D MRI, an additional phase-encoding gradient is related to the $k_z$ axis to acquire data in a third dimension. When the number of phase-encoding levels is smaller than a binary number, the missing data may be filled with zeros to complete the k-space so that an FFT algorithm can be applied.

In k-space, data is arranged in an inhomogeneous distribution such that the data at the center of a k-space map contains low frequency spatial data, that is, the general spatial shape of an object being scanned. The data at the edges of the k-space map contains high frequency spatial data including the spatial edges and details of the object.

In magnetic resonance imaging, for the same set of scan parameters, a shorter scan tends to reduce the signal-to-noise ratio, while a longer scan, which would have a correspondingly larger k-space map, increases the signal-to-noise ratio as well as image quality. Ideally, a fast scan with a high signal-to-noise ratio is preferred.

SUMMARY

The present invention provides a method and apparatus to increase the efficiency of a Magnetic Resonance Imaging (MRI) device by decreasing scan time through modification of the application order of the phase-encoding gradient. In an MRI device, a patient is subjected to a constant magnetic field, and then radio frequency (RF) pulses are used to excite the nuclei in the body of the patient. The nuclei emit a corresponding RF signal as the nuclei relax which can be measured and mapped into a visual display. The RF pulses used to excite the nuclei in the body of the patient use a slice select gradient, a read out gradient, and a phase-encoding gradient to selectively acquire RF signals from a region of interest. When the phase-encoding gradient is indexed and prioritized according to contribution to image quality, then phase-encoding values with little or no contribution to image quality need not be acquired, but may be replaced by randomized noise. This results in reduced scan time with minimal impact on image quality or improved image quality for an acquisition at the same scan time.

BRIEF DESCRIPTION OF THE DRAWINGS

The features, aspects, and advantages of the present invention will become better understood with regard to the following description, appended claims, and accompanying drawings where:

FIG. 3 illustrates an alternate two-dimensional graph of the phase-encoding gradient measured by a read-out gradient in k-space.

DETAILED DESCRIPTION OF THE INVENTION

The following detailed description is presented to enable any person skilled in the art to make and use the invention. For purposes of explanation, specific nomenclature is set forth to provide a thorough understanding of the present invention. However, it will be apparent to one skilled in the art that these specific details are not required to practice the invention. Descriptions of specific applications are provided only as representative examples. Various modifications to the preferred embodiments will be readily apparent to one skilled in the art, and the general principles defined herein may be applied to other embodiments and applications without departing from the scope of the invention. The present invention is not intended to be limited to the embodiments shown, but is to be accorded the widest possible scope consistent with the principles and features disclosed herein.

The present invention is a magnetic resonance imaging method and apparatus that decreases scan time without reducing the signal-to-noise ratio (SNR) through manipulation of the phase-encoding gradient. SNR is an indicator of image quality. By adaptively applying a phase-encoding gradient as image data is collected, image quality may be evaluated dynamically as the scan progresses. Image quality may also be evaluated as an image is reconstructed to determine whether data collection is sufficient. By dynamically evaluating the image as the phase-encoding gradient is applied, scan times may be reduced without noticeable degradation of image quality. The present invention will be described in detail herein below.

Figure 1:
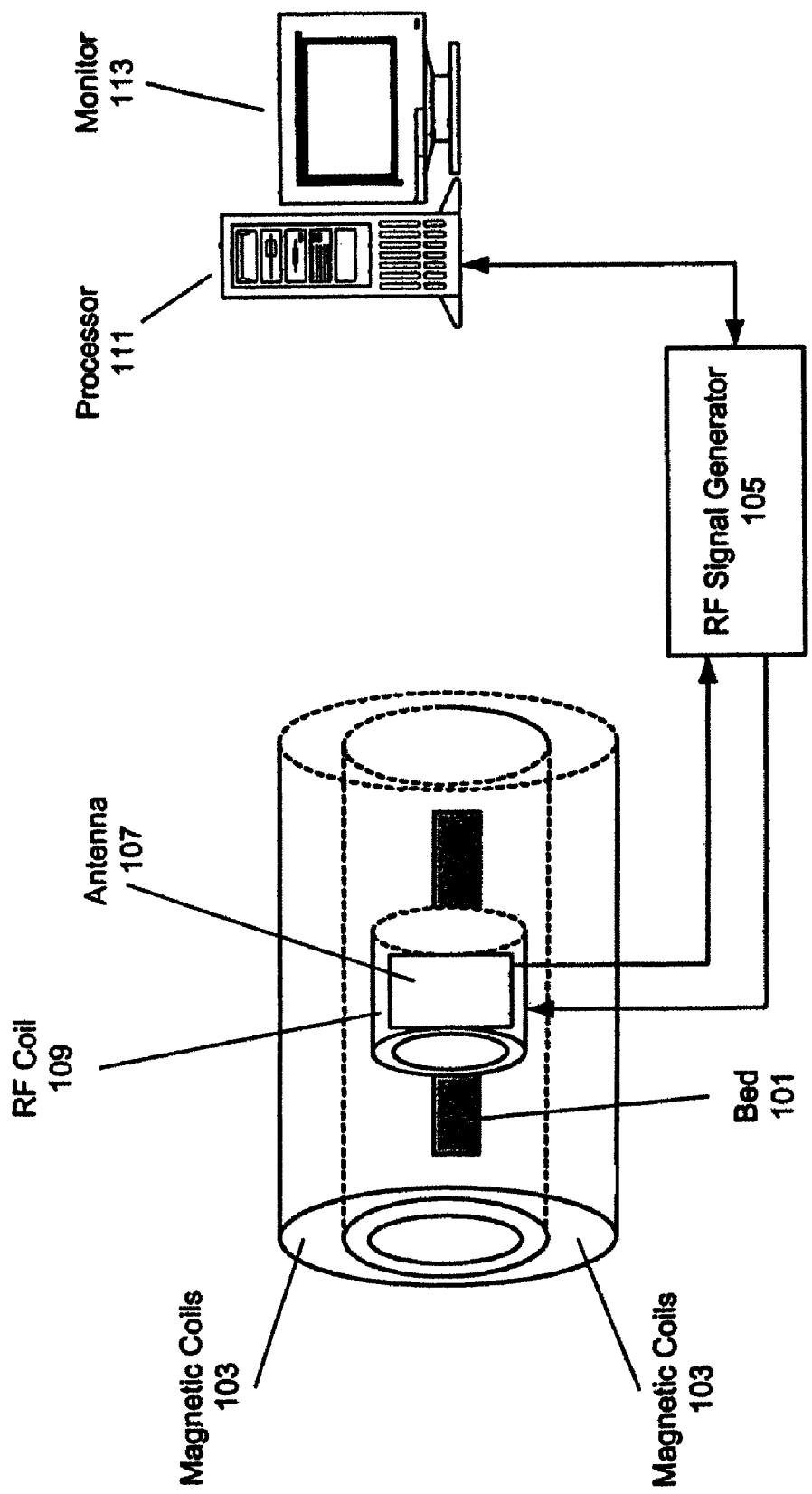
FIG. 1 generally illustrates an MRI apparatus.

A magnetic resonance imaging (MRI) apparatus is shown in FIG. 1. An MRI apparatus has a bed 101, where the object being examined is placed. The object may be a physical culture, a person, an animal, or any other physical object. The bed 101 is surrounded by magnetic coils 103, which generate a constant magnetic field. A radio frequency (RF) signal generator 105 creates RF pulses transmitted by antenna 107 that excite the nuclei of the object being examined. An RF coil 109 receives the relaxation RF signals from the nuclei in the object as the excited nuclei precess. Typically, the nuclei are hydrogen nuclei, but may be any other atom. A processor 111 processes the received RF emission signals from the nuclei and displays the information on a monitor 113.

As described hereinabove, magnetic resonance imaging uses phase-encoding to provide mapping along one or more axes in the orthogonal system of k-space. The received RF signal intensity decreases as the phase-coding gradient strength is increased. This effect is modulated by the structure and size of the object being imaged, which determines the zero crossings as well as the size and shape of the signal intensity envelope. The SNR of the phase-encoded signal is a function of the phase-encoding gradient and the properties of the object being imaged. The contribution to image quality of the signals with a high SNR is dominant while the contribution of signals with a low SNR is very low. However, such low SNR signals affect image quality by contributing high frequency spatial information to the image. Additionally, if the signal amplitude is buried in noise, it has no contribution at all and may actually lower image quality.

In the present invention, the phase-encoding levels that contribute to image quality are applied according to a priority scale when the maximum intensity (amplitude and shape) of the phase-encoding gradient is known. Initially, a read-out gradient of known intensity may be applied in the intended phase-encoding direction in order to acquire the local maximum intensity of the phase-encoding gradient. Several signals may be averaged to decrease statistical error.

Figure 2:
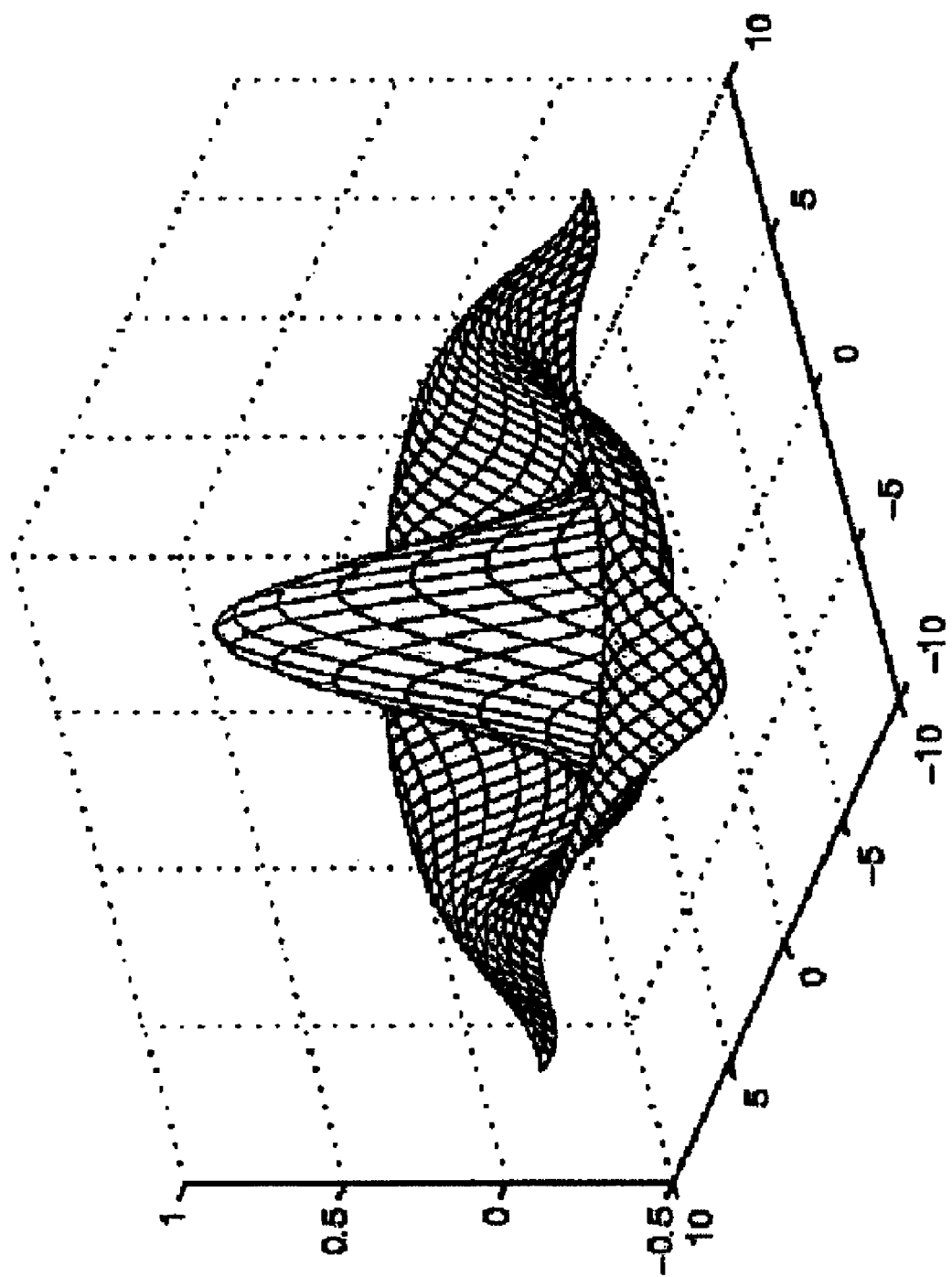
FIG. 2 illustrates a graph of the phase-encoding gradient measured by a readout gradient in k-space.

An example of the result of data for an acquisition of a typical scan for an object is shown in FIG. 2. The 3D graph in FIG. 2 shows the intensity of time domain MRI data in k-space. As shown, MRI signal data has positive and negative peaks, as well as zero crossings in both the $k_x$ and $k_y$ directions. The signals at the peaks contribute greatly to SNR and should have high priority, while the signals at the zero crossings contribute to resolution, but contribute little to overall SNR. The zero crossings at the higher phase-encoding levels have the least contribution to SNR but still contribute to resolution. Typically, the signals at the zero crossings have random values of the noise typical to the specific parameters. These values do not need to be acquired at all, but rather can be replaced by noise values with the proper statistical characteristics. The phase-encoding signals close to the zero crossings, especially at the higher phase-encoding levels, have marginal contribution to image quality and may be assigned a lower priority.

With respect now to FIG. 3, a 2D graph showing the relationship of the phase-encoding gradient and signal intensity is shown. The x-axis shows the phase-encoding gradient amplitude and the y-axis shows the returned RF signal intensity (acquired RF signal). On the curve, the X's marks the maximum and minimum values, while the circles mark the zero crossings. The triangles denote phase encoding midpoints, M, which occur midway between a maximum or a minimum and a zero crossing. Additionally, the squares represent additional phase encoding midpoints that occur midway between an M phase encoding midpoint and a maximum or a minimum or a zero crossing. In the graph, it is clear that the signal is most intense at the maximum and minimum peaks of the signal curve. The curve shows several levels of priority. Of highest priority are the values at the maximum and minimum peaks, that is, at the X's, which increase image quality. Of next highest priority are the values at the triangles, which also contribute to image quality. Of third highest priority are the values at the squares. If necessary, some of the lower priority data may not be acquired but may be replaced by noise values. Data along the curve at the non-zero crossing points that is not actively collected will be filled in by interpolation of previously collected data or by previously calculated values. By selectively acquiring signal data at the points of greatest priority, efficient use of the MRI system is made without a noticeable degradation of image quality.

To prevent obfuscation, the triangle and square notations are made only within proximity to the origin of the axes in FIG. 3, but it should be understood that additional midpoints may be graphed as well.

Figure 4A:
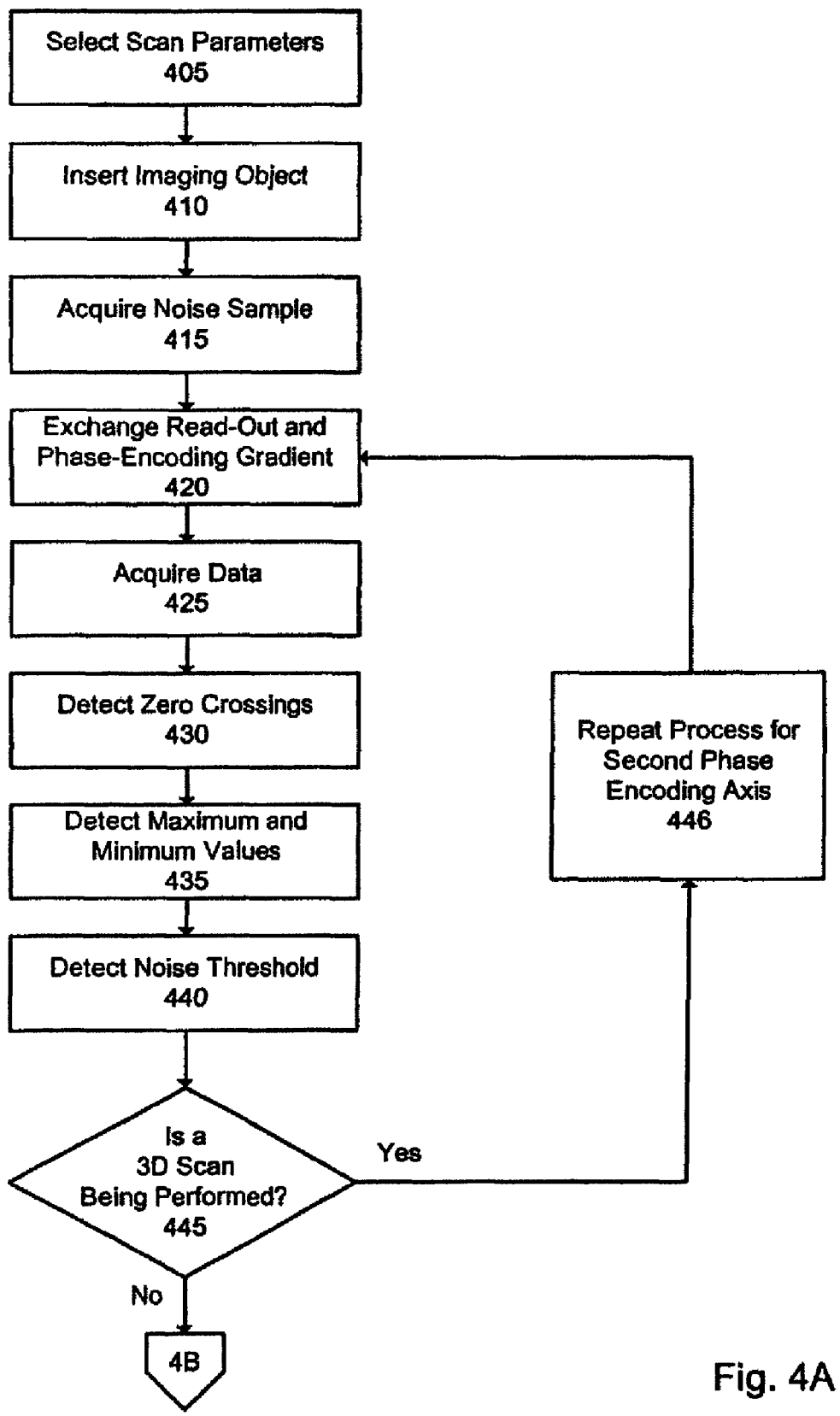
FIGS. 4A and 4B illustrate a flowchart showing the operation of an MRI imaging apparatus in accordance with the present invention.

A flowchart showing a method implementing the present invention is shown in FIG. 4A. Initially, the scan parameters are selected (step 405). The object to be scanned is inserted into the MRI apparatus (step 410) and a noise sample is acquired (step 415), which can be generated using proper statistical parameters. In order to acquire the information of FIGS. 2 and 3, the read-out gradient waveform is used on the phase-encoding axis of the scan (step 420) to determine the local maximum of the phase encoding gradient, and the data is over sampled and averaged (step 425). From the acquired data, the zero crossings are detected and indexed (step 430). The maximum and minimum values are detected and indexed (step 435). Also, a threshold is detected to demarcate the boundary between signal and noise (step 440). If the scan is 3D, then steps 420 through 445 are repeated on the second phase-encoding axis (step 446).

Figure 4B:
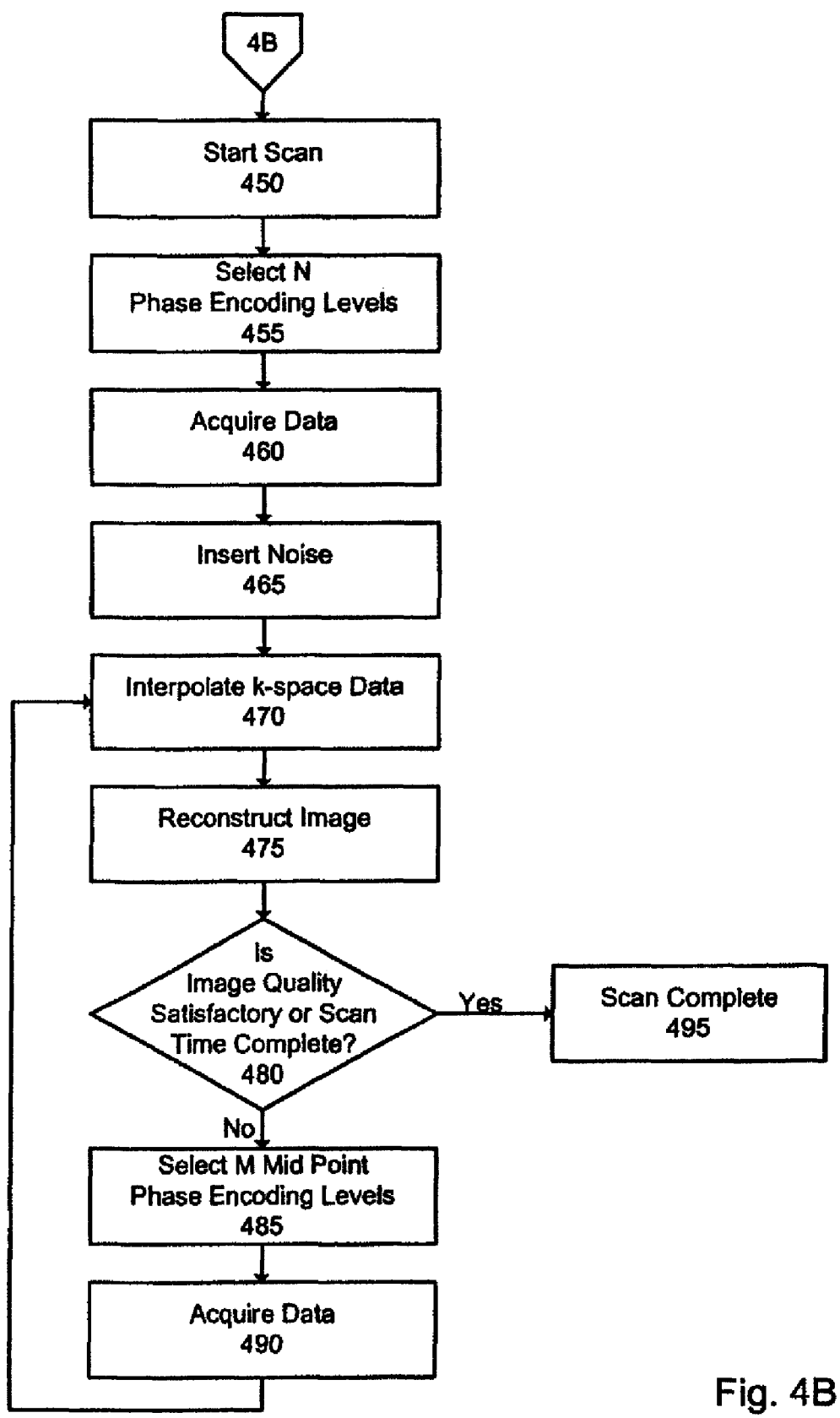

Referring to FIG. 4B, a nominal scan is initiated (step 450). Using the index of maximum and minimum values, N phase-encoding levels are selected (step 455). These levels typically range from I to 1024 steps (that is, N=1 to N=1024) but may be any integer number. According to the selected N phase-encoding levels, the MRI imaging data is acquired (step 460). At the indexed zero crossings of the phase-encoding gradient, randomized noise is inserted (step 465). The k-space data is interpolated (step 470) and the image is reconstructed (step 475). If the image quality is satisfactory, or the predetermined scan time is completed (step 480), then the scan is complete (step 495). However, if the image quality is unsatisfactory, or if additional scan time remains, the M phase-encoding mid-points are selected between the already existing k-space locations (step 485). According to the M phase-encoding mid-points, further MRI imaging data is acquired (step 490). If the M phase-encoding mid-points include signal levels below the noise threshold, then the data will not be acquired at those points. After the additional M phase-encoding data is acquired, the k-space data is interpolated again (step 470), and the image is reconstructed (step 475). Again, if the image quality is satisfactory and the scan time is completed (step 480), then the scan is complete (step 495). If the image quality is unsatisfactory, or if additional scan time remains, the next priority level phase-encoding midpoints are selected between the existing k-space locations, and additional MRI data is acquired. If these phase-encoding midpoints include signal levels below the noise threshold, data is not acquired at those points. After this additional phase-encoding data is acquired, the k-space data is again interpolated. This prioritization process continues until the image is satisfactory or the scan time is completed. At the end of the scan, the k-space is filled by a distribution based on the priority criteria.

This method optimizes the MRI image quality per unit of time, significantly shortening the length of scan time. The scan time may be predetermined value or may be determined by a computer or an online image qualification process based on an operator judgment. Image quality may be additionally be determined by a number of objective measures including, for example, a measurement of the sum of the magnitudes of image pixels in the in-progress image or a measurement of the sum of the coefficients of a fast Fourier transform of a projection of the in-progress image. The priority strategy may be varied to reflect more specific image quality requirements in accordance with medical diagnosis emphasis.

The foregoing description of the present invention provides illustration and description, but is not intended to be exhaustive or to limit the invention to the precise one disclosed. Modifications and variations are possible consistent with the above teachings or may be acquired from practice of the invention. Thus, it is noted that the scope of the invention is defined by the claims and their equivalents.

What is claimed:

1. A magnetic resonance image device comprising:
a magnetic field generator;
a radio frequency signal generator, said radio frequency generator exciting respective atomic nuclei within an object;
a radio frequency receiver for receiving respective relaxation magnetic resonance signals during a scan from said respective atomic nuclei; and
a processor, said processor processing respective relaxation magnetic resonance signals of a priority criteria scan of said object, said priority criteria scan acquiring data employing a plurality of phase-encoding levels,
said processor ascertaining at least one priority criteria from said priority criteria scan data, said at least one priority criteria including values at a maximum and a minimum peak of said plurality of phase-encoding levels,
whereby a subsequent full scan of said object employs said at least one priority criteria to enhance image quality and reduce scan time.

2. The magnetic resonance image device according to claim 1, wherein said at least one priority criteria is selected from the group consisting of maximum peak values, minimum peak values, zero crossing values, and phase encoding midpoints.

3. The magnetic resonance image device according to claim 2, wherein a maximum peak value is ascertained by oversampling and averaging.

4. The magnetic resonance image device according to claim 1, wherein a noise threshold is ascertained from said priority criteria scan data, said noise threshold demarcating a boundary between signal and noise.

5. The magnetic resonance image device according to claim 1, wherein said priority criteria scan data correlates to features of a k-space map of the priority criteria scan data.

6. The magnetic resonance image device according to claim 1, wherein said priority criteria scan data is indexed.

7. The magnetic resonance image device according to claim 1, further comprising:
said processor, pursuant to said at least one priority criteria, selectively acquiring signal data of said object in a subsequent scan, and
selectively inserting noise data at particular data indexes of said object instead of scanning same,
whereby image quality is enhanced by maximizing the usage of high priority scan data and reducing scan time.

8. The magnetic resonance image device according to claim 7, wherein, after completion of said selectively acquiring and selectively inserting, a corresponding k-space is filled pursuant to the application of said at least one priority criteria.

9. The magnetic resonance image device according to claim 7, wherein, after completion of a priority criteria scan, an image is constructed based upon the selectively acquired and selectively inserted signal data, said image being evaluated dynamically for image quality; and if further processing is required to improve image quality, a plurality of mid-point phase encoding levels are selected and applied, and the priority criteria scan re-run on said object with said new priority criteria.

10. A method for reducing scan time in a magnetic resonance imaging scan, said method comprising:

performing a priority criteria scan of an object, said priority criteria scan acquiring data employing a plurality of phase-encoding levels; and ascertaining at least one priority criteria from said priority criteria scan data, said priority criteria scan data including values at a maximum and a minimum peak of said phase-encoding levels, whereby a subsequent full scan of said object employs said at least one priority criteria to enhance image quality and reduce scan time.

11. The method according to claim 10, wherein said at least one priority criteria is selected from the group consisting of maximum peak values, minimum peak values, zero crossing values and phase encoding midpoints.

12. The method according to claim 11, wherein a maximum peak value is ascertained by oversampling and averaging.

13. The method according to claim 10, wherein a noise threshold is ascertained from said priority criteria scan data, said noise threshold demarcating a boundary between signal and noise.

14. The method according to claim 10, wherein said priority criteria scan data correlates to features of a k-space map of the priority criteria scan data.

15. The method according to claim 10, further comprising: indexing said priority criteria scan data.

16. The method according to claim 10, wherein said step of performing a priority criteria scan on said object further comprises:

employing a read-out gradient on a phase-encoding gradient.

17. The method according to claim 10, further comprising:

scanning said object in a subsequent scan pursuant to said at least one priority criteria;

pursuant to said at least one priority criteria, selectively acquiring signal data of said object, and selectively inserting noise data at particular data indexes of said object instead of scanning same; and completing the scan of said object pursuant to said at least one priority criteria.

18. The method according to claim 17, wherein, after completion of said scanning, a corresponding k-space is filled pursuant to the application of said at least one priority criteria.

19. The method according to claim 17, further comprising:

after completion of said scan, constructing an image of said object based on the selectively acquired and selectively inserted data;

evaluating said image for image quality; and if further scanning is required to improve image quality, selecting a plurality of mid-point phase encoding levels and applying same, and re-running said priority criteria scan of said object with new priority criteria.

20. A magnetic resonance image device comprising:

means for performing a priority criteria scan of an object, said priority criteria scan acquiring data employing a plurality of phase-encoding levels; and means for ascertaining at least one priority criteria from said priority criteria scan data, said priority criteria scan data including values at a maximum and a minimum peak of said phase-encoding levels, whereby a subsequent full scan of said object employs said at least one priority criteria to enhance image quality and reduce scan time.

* * * * *